(12) United States Patent
Yu

(10) Patent No.: US 6,468,888 B1
(45) Date of Patent: Oct. 22, 2002

(54) METHOD FOR FORMING POLYSILICON-GERMANIUM GATE IN CMOS TRANSISTOR AND DEVICE MADE THEREBY

(75) Inventor: Bin Yu, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 61 days.

(21) Appl. No.: 09/685,974

(22) Filed: Oct. 10, 2000

Related U.S. Application Data

(62) Division of application No. 09/162,917, filed on Sep. 29, 1998, now Pat. No. 6,180,499.

(51) Int. Cl.[7] ............................................. H01L 21/3205
(52) U.S. Cl. ..................... 438/592; 438/585; 438/530; 438/532
(58) Field of Search ................................ 257/368, 376, 257/402, 407; 438/528, 530, 532, 585, 591, 592, 232, 306, FOR 177, FOR 193

(56) References Cited

U.S. PATENT DOCUMENTS

| | | | |
|---|---|---|---|
| 5,141,895 A | * | 8/1992 | Pfiester et al. .............. 438/289 |
| 5,633,177 A | * | 5/1997 | Anjum ........................ 438/301 |
| 6,030,874 A | * | 2/2000 | Grider et al. ................ 438/301 |
| 6,252,283 B1 | * | 6/2001 | Gardner et al. .............. 257/407 |
| 6,262,456 B1 | * | 7/2001 | Yu et al. ...................... 257/371 |
| 2002/0005581 A1 | * | 1/2002 | Kurata ......................... 257/756 |

* cited by examiner

*Primary Examiner*—Carl Whitehead, Jr.
*Assistant Examiner*—Toniae M Thomas
(74) *Attorney, Agent, or Firm*—LaRiviere, Grubman & Payne, LLP

(57) ABSTRACT

A method for making a ULSI MOSFET chip includes forming transistor gates on a substrate and a semiconductor device thereby made. The gates are formed by depositing a polysilicon layer on the substrate, implanting germanium into the polysilicon layer at a comparatively low dose, and then oxidizing the doped polysilicon layer. Under the influence of the oxidation, the germanium is repelled from an upper sacrificial region of the polysilicon layer into a lower gate region of the polysilicon layer, thereby increasing the germanium concentration in the lower gate region. The sacrificial region is then etched away and an undoped polysilicon film deposited on the gate region. Subsequently, the gate region with undoped polysilicon film is patterned to establish a MOSFET gate, with the substrate then being appropriately processed to establish MOSFET source/drain regions.

4 Claims, 2 Drawing Sheets

METHOD FOR FORMING POLYSILICON-GERMANIUM GATE IN CMOS TRANSISTOR AND DEVICE MADE THEREBY

RELATED APPLICATION

This application is a divisional patent application of U.S. patent application Ser. No. 09/162,917, entitled "METHOD FOR FORMING POLYSILICON-GERMANIUM GATE IN CMOS TRANSISTOR AND DEVICE MADE THEREBY", filed Sep. 29, 1998, issued as U.S. Pat. No. 6,180,499 B1, on Jan.30, 2001, by the same Applicant.

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer, with small portions of the source and drain regions, referred to as "extensions", extending toward and virtually under the gate. This generally-described structure cooperates to function as a transistor.

As discussed above, conventional transistor gates are made of polysilicon. As recognized herein, adding germanium to the polysilicon to render a transistor gate composition having the pseudo-chemical formula poly-$Si_{1-x}Ge_x$ results in certain advantages over conventional polysilicon gates. One advantage is that a transistor with a poly-$Si_{1-x}Ge_x$ gate structure has a "variable work function". Stated differently, the threshold voltage of the transistor (a critical transistor performance characteristic) can be established by appropriately establishing the mole fraction of the germanium in the gate. This is a better way to establish a desired threshold voltage than by adjusting the dopant concentration in the channel region (i.e., the region between the source and drain under the gate), as currently must be done in polysilicon gate devices, because adjusting the dopant concentration in channel regions can cause unwanted short-channel effect and degradation of channel carrier mobility. Both short-channel effect and degradation of channel carrier mobility degrade the performance of the transistor.

Furthermore, when germanium is used in a polysilicon transistor gate, the dopant can be activated using lower activation temperatures during fabrication. Looked at another way, at a given temperature more dopant per unit time can be activated in poly-$Si_{1-x}Ge_x$ gate material than in polysilicon gate material. Consequently, two phenomena that degrade transistor performance—gate sheet resistance and gate depletion effect—are reduced in poly-$Si_{1-x}Ge_x$ gates vis-a-vis polysilicon gates. Moreover, in general it is desirable to use relatively low temperatures, including low dopant activation temperatures, during semiconductor fabrication to reduce process cost and complexity and to reduce the risk of temperature-induced damage to chip components.

With the above in mind, the present invention recognizes the desirability of incorporating germanium into polysilicon transistor gates. However, the present invention further recognizes that a relatively high dose of germanium in the polysilicon must be implanted to achieve the above-mentioned advantages. Indeed, germanium doses in the range of $8 \times 10^{16}$ germanium atoms per square centimeter to $1 \times 10^{17}$ germanium atoms per square centimeter are required. As understood by the present invention, to achieve such high germanium doses, the implantation of germanium into the gate requires many hours, thereby prolonging fabrication time and correspondingly reducing production throughput. Fortunately, the present invention addresses the problem of achieving high germanium doses in polysilicon transistor gates while minimizing fabrication time and, thus, improving production throughput.

BRIEF SUMMARY OF THE INVENTION

A method is disclosed for establishing MOSFETs on a semiconductor device by forming a gate polysilicon layer on a semiconductor substrate, and then implanting germanium into the gate polysilicon layer. After implanting the germanium, the germanium is concentrated in a gate region of the gate polysilicon layer. In the preferred embodiment, the germanium is implanted into the gate polysilicon layer at a relatively low dose, preferably no more than $7 \times 10^{16}$ germanium atoms per square centimeter and more preferably no more than $1.6 \times 10^{16}$ germanium atoms per square centimeter.

Preferably, the concentrating step is undertaken by oxidizing a sacrificial region of the gate polysilicon layer to cause germanium in the sacrificial region to move into the gate region under the effect of interface dopant segregation. The germanium ion is repelled by the oxidized polysilicon sacrificial region, thus more germanium ions move into the gate region. Further, the sacrificial region is removed after the concentrating step, and an undoped polysilicon film deposited on the gate region. The polysilicon film and gate region are then patterned to establish one or more transistor gates on the substrate. A semiconductor device made according to the present method, and a digital processing apparatus incorporating the device, are also disclosed.

In another aspect, a method for making a semiconductor device includes forming at least one gate on a semiconductor substrate. The gate includes a gate insulating layer facing the substrate, and a polysilicon-germanium gate region on the gate insulating layer. Also, the gate includes a polysilicon layer on the gate region, with the polysilicon layer being substantially free of germanium.

In still another aspect, a semiconductor device includes a semiconductor substrate and one or more gate insulating layers on the substrate. One or more transistor gates are on the gate insulating layer. In accordance with the present invention, each gate includes a polysilicon-germanium gate region next to the gate insulating layer and an undoped polysilicon film on the polysilicon-germanium gate region.

Other features of the present invention are disclosed or apparent in the section entitled "DETAILED DESCRIPTION OF THE INVENTION".

DETAILED DESCRIPTION OF THE INVENTION

Figure 1:
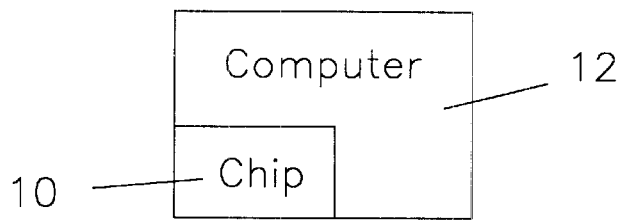
FIG. 1 is a schematic diagram of a semiconductor device made according to the present invention, shown in combination with a digital processing apparatus.

Referring initially to FIG. 1, a semiconductor device embodied as a chip 10 is shown incorporated into a digital processing apparatus such as a computer 12. The chip 10 is made in accordance with the below disclosure.

Figure 2:
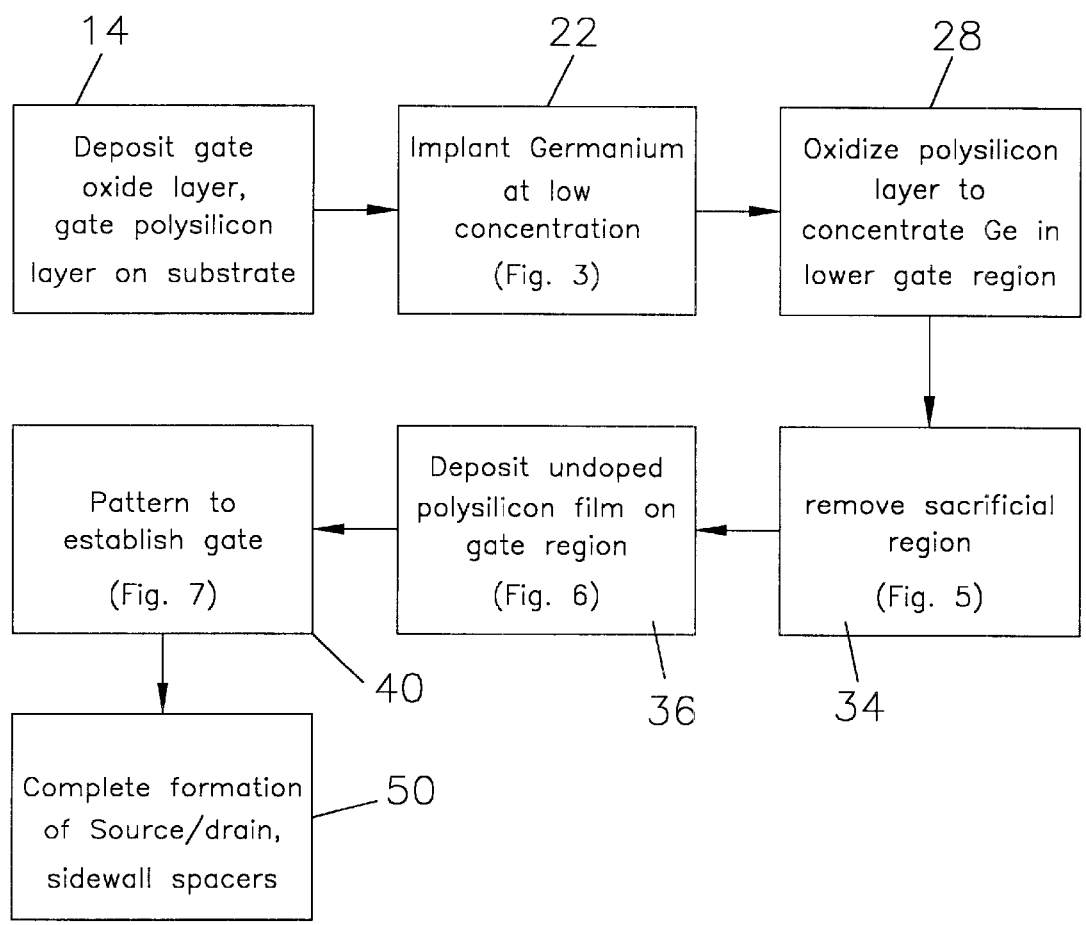
FIG. 2 is a flow chart showing the steps of the present invention.
Figure 3:
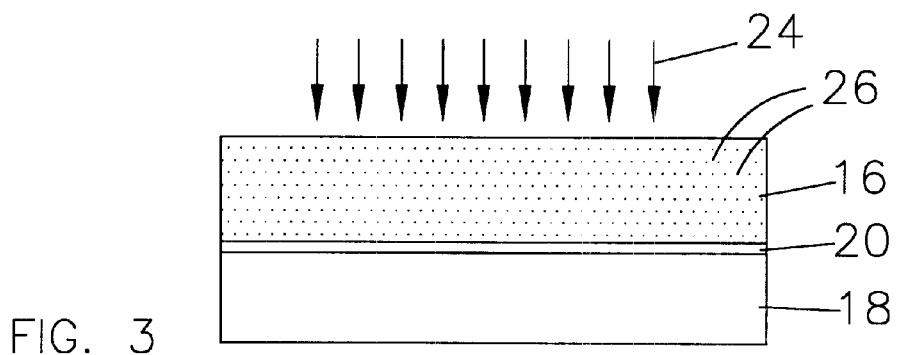
FIG. 3 is a side view of the device after the gate polysilicon and gate oxide layers have been formed, during implantation of the germanium.

Now referring to FIGS. 2 and 3, as indicated at block 14 in FIG. 2 and as shown in FIG. 3, using conventional semiconductor fabrication techniques including low pressure chemical vapor deposition (LPCVD), a transistor gate layer 16 made of polysilicon is formed on a silicon or other semiconductor substrate 18. Between the gate layer 16 and substrate 18 is a thin insulating gate oxide layer 20 that faces the substrate 18.

Moving to block 22, germanium (Ge) is implanted into the polysilicon layer 16 as indicated by the arrows 24. In FIG. 3, the germanium is indicated by dots 26. As intended by the present invention, the germanium is implanted into the polysilicon layer 16 at a comparatively low dose, preferably at a dose of no more than $7 \times 10^{16}$ germanium atoms per square centimeter, and more preferably at a dose of no more than $1.6 \times 10^{16}$ germanium atoms per square centimeter. As envisioned herein, the germanium is implanted at a dose of about 10%–20% of the final dose required to form an effective polysilicon-germanium transistor gate.

Figure 4:
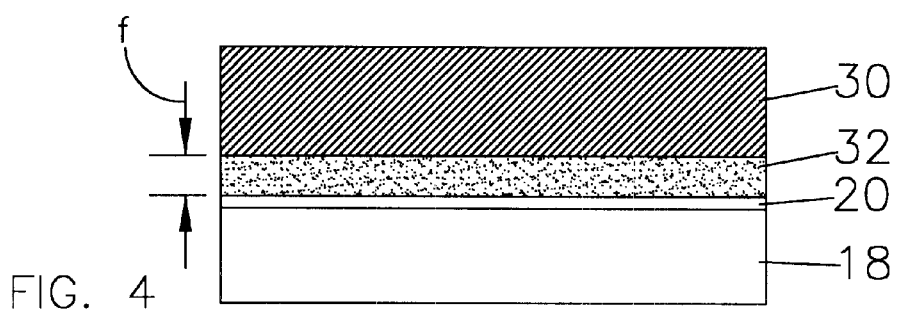
FIG. 4 is a side view of the device after thermal oxidation of the sacrificial region of the gate layer.

Moving to block 28 of FIG. 2 and now referring to FIG. 4, the polysilicon layer 16 is thermally oxidized. Under the influence of the oxidation at block 28, the germanium is repelled from an upper sacrificial region 30 of the polysilicon layer 16 into a lower gate region 32 of the polysilicon layer 16, thereby increasing the germanium concentration in the lower gate region 32. More particularly, the germanium ions move into the gate region 32 under the effect of interface dopant segregation. In other words, the germanium ions are repelled by the oxidized polysilicon sacrificial region 30, thus more germanium ions move into the gate region 32.

Per the preferred embodiment, the effective dose of the germanium in the gate region 32 after the oxidizing step is at least $8 \times 10^{16}$ germanium atoms per square centimeter. As intended herein, the gate region 32 can advantageously be relatively thin, e.g., the thickness "t" of the gate region 32 can be about one hundred Angstroms to two hundred Angstroms (100 Å–200 Å). With this thickness, the gate region 32 effectively suppresses undesirable gate depletion effects while facilitating the establishment of the work function of the gate to be subsequently formed as discussed below.

During the high temperature oxidation process, polysilicon-germanium grains, represented by the pseudo-chemical formula poly-$Si_{1-x}Ge_x$, are formed in the gate region 32. Moreover, as understood by the present invention the high temperature oxidation process also serves to anneal defects in the above-disclosed structure that might have been caused by implantation. Still further, the germanium concentration in the gate region 32 can be precisely controlled by precisely controlling the germanium implant rate and the amount of consumption of the polysilicon (i.e., the extent of the sacrificial region 30) during the oxidation step.

Figure 5:
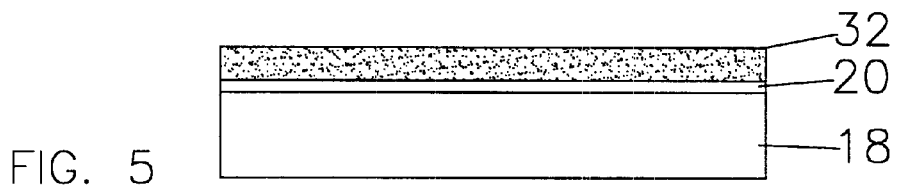
FIG. 5 is a side view of the device after the sacrificial region of the gate layer has been removed.
Figure 6:
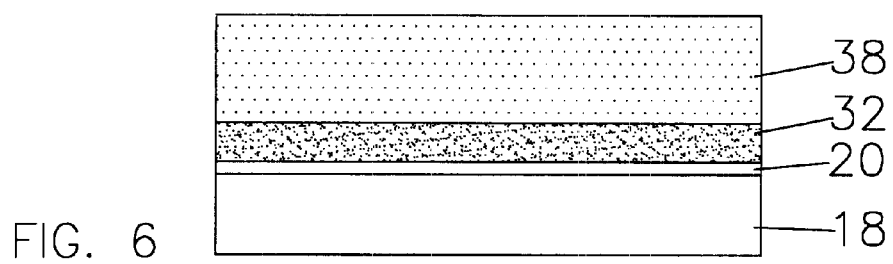
FIG. 6 is a side view of the device after deposition of the undoped polysilicon film onto the gate layer.

Moving to block 34 and now referring to FIG. 5, the sacrificial region 30 of the polysilicon layer 16 is removed, preferably by etching it away. Then, at block 36 and referring to FIG. 6, an undoped polysilicon film 38 that is substantially free of germanium is deposited on the gate region 32 for, among other things, facilitating subsequent silicidizing of the gate and for completing the gate electrode structure.

Figure 7:
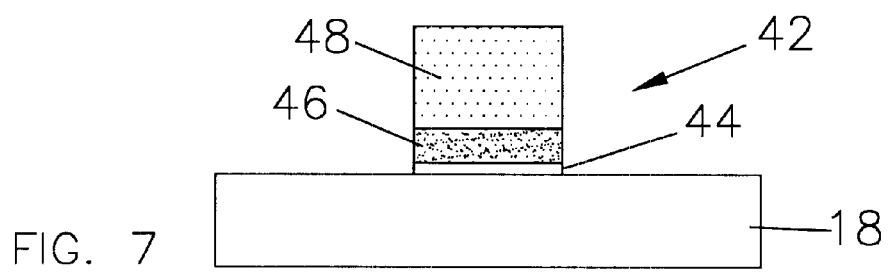
FIG. 7 is a side view of the device after gate patterning.

Proceeding to block 40 and referring to FIG. 7, the above-disclosed structure is patterned according to means known in the art to establish one or more gates, generally designated 42, on the substrate 18. It can now be appreciated that each transistor gate 42 of the present invention includes a gate insulating layer 44 that faces the substrate 18, a polysilicon-germanium gate region 46 on the gate insulating layer 44, and a polysilicon layer 46 on the gate region 44. At block 50, fabrication is completed in accordance with well-known principles to form source/drain regions, sidewall spacers, and silicide to thereby establish a MOSFET transistor having a gate 42.

While the particular METHOD FOR FORMING POLYSILICON-GERMANIUM GATE IN CMOS TRANSISTOR AND DEVICE MADE THEREBY as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A semiconductor device fabricated by a method for establishing at least one transistor thereon, the method comprising:

a. forming at least one gate polysilicon layer above a gate insulating layer on a semiconductor substrate;

b. implanting germanium into the gate polysilicon layer; and c. after implanting the germanium, oxidizing a sacrificial region of the gate polysilicon layer to cause germanium in the sacrificial region to move up into a gate region of the gate polysilicon layer;

d. removing the sacrificial region of the gate polysilicon layer; and e. depositing an undoped polysilicon film directly onto the gate region.

2. A digital processing apparatus incorporating the device of claim 1.

3. A semiconductor device made according to a method for making a semiconductor device, the method comprising:

forming at least one gate on the semiconductor substrate, the gate including:
   a gate insulating layer facing the substrate;
   a polysilicon-germanium gate region on the gate insulating layer; and
   a polysilicon layer on the gate region in contact therewith, the polysilicon layer being substantially free of germanium, wherein the forming step includes:
   forming at least one gate polysilicon layer on the semiconductor substrate above the gate insulating layer;
   implanting germanium into the gate polysilicon layer; and
   after implanting the germanium, oxidizing a sacrificial region of the gate polysilicon layer to cause germanium in the sacrificial region to move into the gate region.

4. A digital processing apparatus incorporating the device of claim 3.

* * * * *